United States Patent [19]

Iwase

[11] Patent Number: 5,323,412
[45] Date of Patent: Jun. 21, 1994

[54] SEMICONDUCTOR LASER DEVICE
[75] Inventor: Masayuki Iwase, Tokyo, Japan
[73] Assignee: The Furukawa Electric Co., Ltd., Tokyo, Japan
[21] Appl. No.: 15,340
[22] Filed: Feb. 9, 1993
[30] Foreign Application Priority Data
 Feb. 10, 1992 [JP] Japan .................. 4-057366
[51] Int. Cl.[5] .............................. H01S 3/19
[52] U.S. Cl. .......................... 372/46; 372/45
[58] Field of Search ..................... 372/46, 45
[56] References Cited

U.S. PATENT DOCUMENTS

| 4,692,206 | 9/1987 | Kaneiwa et al. | 372/46 |
| 4,730,329 | 3/1988 | Yoshida et al. | 372/46 |
| 4,779,282 | 10/1988 | Ng | 372/446 |
| 4,799,227 | 1/1989 | Kaneiwa et al. | 372/46 |
| 4,935,936 | 6/1990 | Nelson et al. | 372/46 |
| 4,972,238 | 11/1990 | Tanaka | 372/46 |
| 4,977,568 | 12/1990 | Yamamoto et al. | 372/46 |

*Primary Examiner*—Georgia Y. Epps
*Attorney, Agent, or Firm*—Jacobson, Price, Holman & Stern

[57] ABSTRACT

A semiconductor laser device comprises a III-V group p-type compound semiconductor substrate, a mesa-shaped narrow and straight multilayer double heterostructure having an active layer therein and blocking layers formed on the lateral sides of said double heterostructure in a pnp layer arrangement, and the n-type layer of said blocking layers is kept away from the lateral sides of the double heterostructure having an active layer.

4 Claims, 2 Drawing Sheets

SEMICONDUCTOR LASER DEVICE

BACKGROUND OF THE INVENTION

1. Technical Field

This invention relates to a semiconductor laser device to be suitably used for a light source of an optical telecommunication system or an optical data processing system.

2. Prior Art

As is well known, semiconductor laser devices realized by using III-V group compounds, InGaAsP-InP semiconductor laser devices in particular, play a vital role in modern optical telecommunication and data processing systems.

For instance, a III-V group compound semiconductor laser device comprising an active layer for laser oscillation surrounded by a heterojunction interface and a p-type substrate has remarkable advantages as described below.

Firstly, since a pnp interface having a large pressure resistance for the pn junction is used for the buried blocking layers of the device, the device will have an output capacity higher than that of a device comprising an n-type substrate and is operational at high temperature.

Secondly, since its p-type ohmic electrode is formed on a P-type semiconductor substrate containing impurities at a higher level, their contact resistance is rather low, making the device a low energy consuming one.

FIG. 2 of the accompanying drawings illustrates a buried type semiconductor laser device comprising a p-InP substrates as disclosed in Laid Open Japanese Patent Application No. 61-190993.

This known semiconductor laser device may be prepared typically by a process as described below.

In the first crystal growth step, a p-InP clad layer 22, an InGaAs active layer 23 and another p-InP clad layer 24 are sequentially formed on the (100) surface of p-InP substrate 21.

In the following etching step, the upper surface of the p-InP clad layer 22 is covered with a 1.5 to 2.0 m wide dielectric mask along a center line of the clad layer 22 and thereafter the p-InP clad layer 22 is etched down to the p-InP substrate 21 except the masked area to produce a straight and narrow mesa.

In the second crystal growth step, a p-InP buried layer 25 is formed on each lateral side of the mesa, which is then sequentially covered by an n-InP buried layer 26 and a p-InP layer 27.

Then, the dielectric mask is removed.

In a third crystal growth step, another n-InP buried layer 28 is formed to cover the upper surface of the mesa as well as the p-InP buried layer 27 located on the lateral sides of the mesa, followed by an n-InP contact layer 29 formed thereon to produce a flat and smooth upper surface for the device.

Then, a p-side electrode 30 and an n-side electrode 31 are formed respectively on the lower surface of the substrate 21 and the upper surface of the n-InP contact layer 29.

Thus, a buried type semiconductor laser device as illustrated in FIG. 2 comprises a p-InP buried layer 25 formed on the lateral sides of the mesa and having a large electric resistance.

The pnpn layer arrangement of the semiconductor laser device yields so many blocking layers that reduce the leakage current.

A known semiconductor laser device of FIG. 2 can, however, show an increased rate of leakage current and hence a high oscillation threshold current if the p-InP buried layer 25 is made thick between the lateral sides of the mesa and the n-InP buried layer 26 as the layer 25 provides a path for the leakage current.

On the other hand, it is very difficult for a semiconductor laser device having a configuration as illustrated in FIG. 2 to exactly show a given distance between the lateral sides of the mesa and the n-InP buried layer 26 because the growth of the thickness of the p-InP buried layer 25 needs to be controlled as a function of the height of the mesa. It is noted that the oscillation threshold current of such a semiconductor laser device can be indefinable particularly when the layers are formed by a liquid phase epitaxial growth technique.

Additionally, if the mesa of the device of FIG. 2 is low, the n-InP buried layer 26 can easily become higher than the mesa such that the n-InP buried layer 26 can eventually reach the n-InP buried layer 28 in the third round of crystal growth to provide a broad way for the leakage current, which by turn can destructively damage the device.

In view of the above described technological problems of existing semiconductor laser devices, it is therefore an object of the present invention to provide a semiconductor laser device that can effectively suppress the leakage current as well as a method for manufacturing such reliable semiconductor laser devices with a high yield and at low cost.

SUMMARY OF THE INVENTION

According to the present invention, the above object is achieved by providing a semiconductor laser device comprising a III-V group p-type compound semiconductor substrate, a mesa-shaped narrow and straight multilayer double heterostructure having an active layer in it and blocking layers formed on the lateral sides of said double hetero structure in a pnp layer arrangement, the n-type layer of said blocking layers being kept away from the lateral sides of the double hetero structure having an active layer.

Said double heterostructure preferably comprises a mixed crystal layer containing a crystal capable of emitting light with a wavelength shorter than that of light emitted by the crystal of the active layer, said mixed crystal layer being disposed between the p-type compound semiconductor substrate and having a lattice plane of (111) facing the lateral sides of the mesa-shaped narrow structure.

Preferably, the p-type compound semiconductor substrate is made of InP and the mixed crystal layer is made of InGaAsP.

According to the present invention, the above object is also achieved by providing a method of producing a semiconductor laser device by forming buried blocking layers in a pnp arrangement on the lateral sides of a mesa-shaped narrow and straight multilayer double heterostructure having an active layer in it and disposed on a III-V p-type compound semiconductor substrate, said method comprising a step of forming an n-type layer on the lateral sides of said double heterostructure by a liquid phase epitaxial growth technique and a step of subsequently forming a p-type layer on the lateral sides of said double heterostructure by a liquid phase epitaxial growth technique.

A semiconductor laser device according to the present invention is advantageous in that it is free from an leakage current between the n-type layer of the blocking layer and the n-InP clad layer of the double heterostructure because the n-type layer is kept away from the lateral sides of the double heterostructure.

According to the present invention, blocking layers are formed on the lateral sides of a double heterostructure by utilizing the fact the a (111) lattice plane is less likely to grow than a (100) plane in a crystal growth.

For instance, if the double heterostructure of a semiconductor laser device according to the invention comprises substrate, an active layer and a mixed crystal layer capable of emitting light with a wavelength shorter than that of light emitted by the active layer and the lattice plane of said mixed crystal layer facing the lateral sides of the mesa-shaped structure is (111) and if an n-type layer is made to grow to reach the mixed crystal layer which is closer to the substrate than the active layer, then the n-type layer would be kept away from the active layer. If, thereafter, a p-type layer is made to grow on the n-type layer, the lateral sides of the active layer are securely covered by that p-type layer which serves as a blocking layer along with the n-type layer.

Semiconductor laser devices having a configuration as described above are, then, free from any significant variances in the leakage current path if they are not strictly identical in the height of the mesa-shaped structure and the growth of the buried film layers.

Additionally, the mixed crystal layer can serve as a barrier for etching if an appropriate material is used for it so that the mesa-shaped structure may constantly be formed to a given height.

Thus, the method of producing a semiconductor laser device according to the present invention provides a way for manufacturing semiconductor laser devices with a high yield and at low cost.

Now, the present invention will be described in greater detail by referring to the accompanying drawings that illustrate preferred embodiment of the invention. It should be noted that it does not limit the scope of and the spirit of the present invention.

DETAILED DESCRIPTION OF THE EMBODIMENT

Figure 1A:
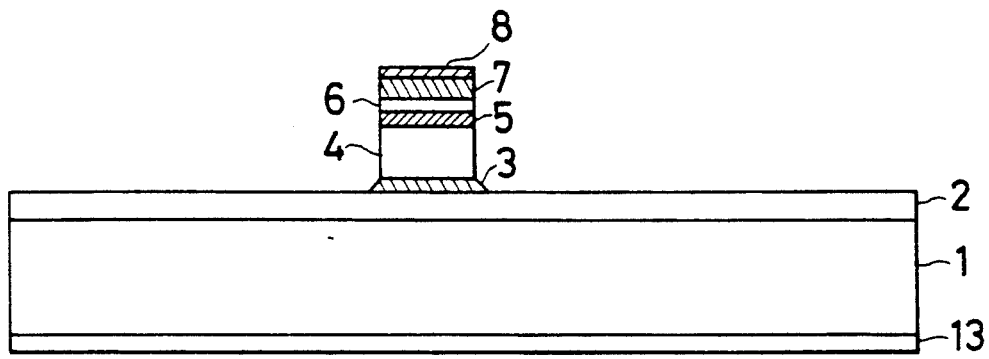
FIGS. 1(a) through 1(c) are sectional view of an embodiment of semiconductor laser device of the present invention shown in three different stages of production.
Figure 1B:
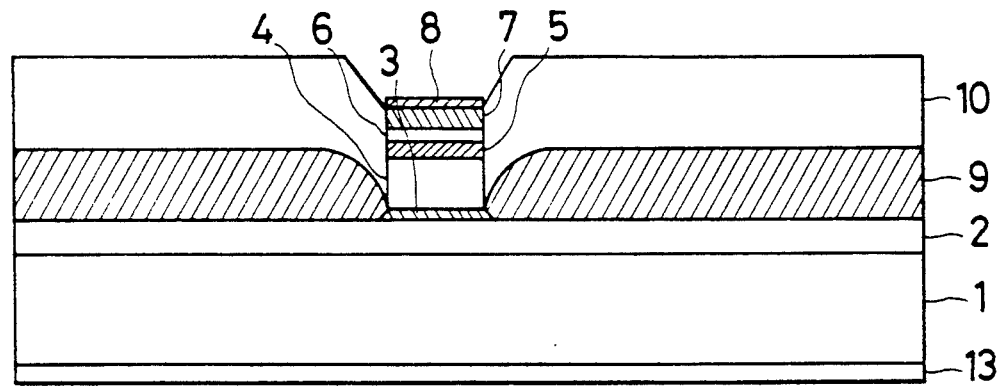
Figure 1C:
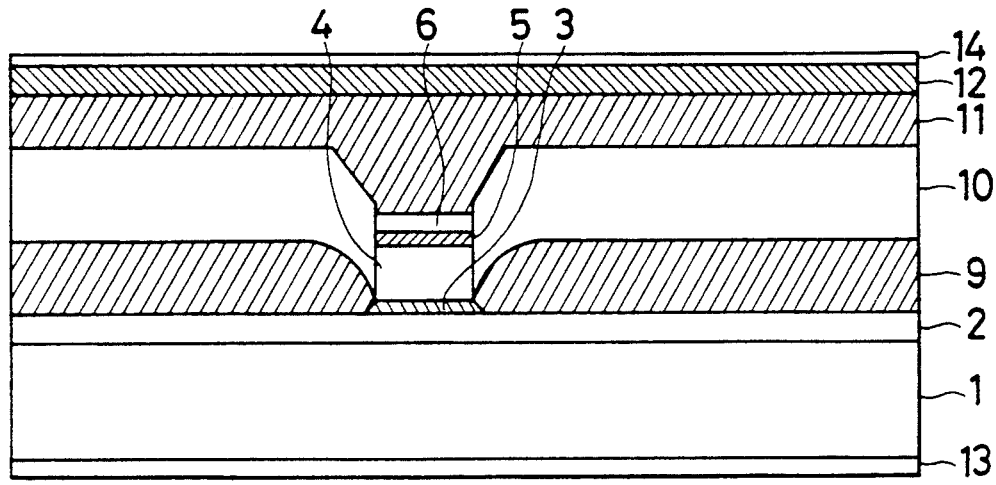
Figure 2:
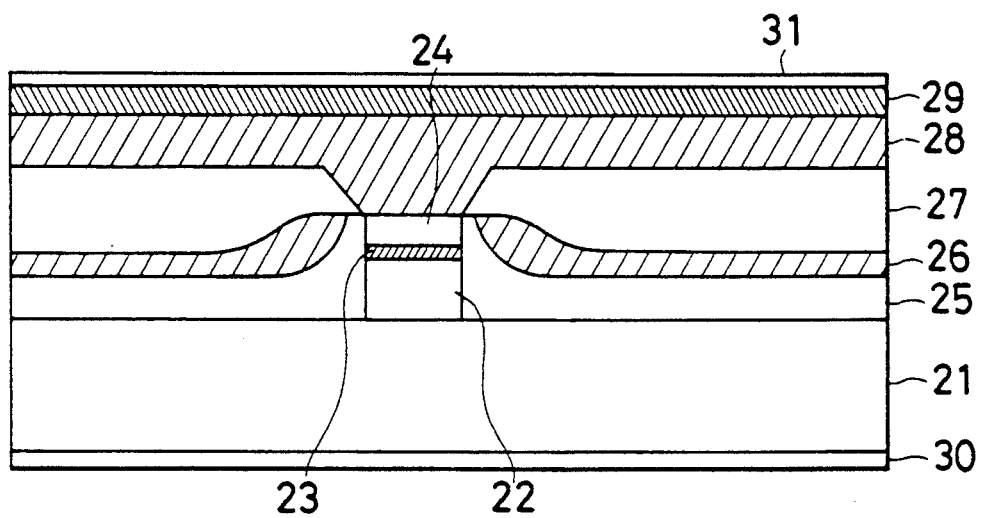
FIG. 2 is a sectional view of a conventional semiconductor laser device.

FIGS. 1(a) through 1(c) show three different steps of preparing a semiconductor laser device according to the invention.

In the step of FIG. 1(a), layers as listed below are sequentially formed on a p-InP substrate 1 to produce a multilayer structure by a liquid crystal epitaxial growth technique or Metal Organic Chemival Vapor Deposition (MOCVD) and the unnecessary portions of the formed multilayer structure are removed by etching.

The layers formed on a (100) plane of a p-InP substrate 1 may include a 2 m thick p-InP buffer layer 2, a 0.2 m thick first p-InGaAsP mixed crystal layer 3 capable of emitting light with a wavelength of 1.1 m, a 0.2 m thick p-InP clad layer 4, a 0.15 m thick second p-InGaAsP mixed crystal layer 5 capable of emitting light with a wavelength of 1.3 m, a 0.5 m thick n-InP clad layer 6 and a 0.3 m thick n-InGaAsP cap layer 7, which are arranged from the bottom to the top in the above mentioned order.

When the multilayer structure is etched, a 1.5 m wide dielectric mask 8 is preliminarily formed as a selectively grown film running along a center line of the upper surface of the n-InGaAsP cap layer 7 in the direction of <110> to partially cover said cap layer 7.

Thereafter, the multilayer structure is wet-etched from the n-InGaAsP cap layer 7 down to the p-InGaAsP mixed layer 3 except the area covered by the dielectric mask 8.

Note that crystal compounds, such as InP and In-GaAsP, may be selectively etched by means of a hydrochloric acid type or sulfuric acid type etchant and that the etched side walls of InP layers may be made perpendicular to the (100) crystal plane if a hydrochloric acid type etchant is used.

For example, the layers may typically be etched in a manner as described below.

Firstly, the n-InGaAsP cap layer 7 is etched by a sulfuric acid type etchant and then the n-InP clad layer 6 is etched by a hydrochloric acid type etchant, followed by the p-InGaAsP active layer 5 to be etched by a sulfuric acid type etchant. Thereafter, the p-InP clad layer 4 is etched by a hydrochloric acid type etchant and finally the p-InGaAsP mixed crystal layer 3 is etched by a sulfuric acid type etchant.

When the operation of etching the p-InGaAsP mixed crystal layer 3 is over, its lateral sides come to show a (111) crystal plane.

In the subsequent step of FIG. 1(b), layers as mentioned below are sequentially formed to fill the etched areas of the multilayer structure by means of a liquid phase epitaxial growth technique, leaving the dielectric mask 8 on the cap layer 7 unremoved.

Firstly, a 1 m thick n-InP layer 9 is deposited on the p-InP buffer layer 2.

At this stage, since the rather small lateral sides of the mixed crystal layer 3 has a (111) plane, the n-InP layer 9 would not be raised above the layer 3 along its lateral sides.

Then, a 2 m thick p-InP 10 is deposited thereon to cover the upper surface of the n-InP layer 9 and, at the same time, fill the gaps between the n-InP layer 9 and the lateral sides of the mesa.

While the upper surface of the deposited p-InP layer 10 is located above the mesa, the layer 10 is not found on the top of the dielectric mask 8 which is a selectively grown film.

In the step of FIG. 1(c), the dielectric mask 8 and the cap layer 7 are removed by etching and the following layers are sequentially formed by a liquid phase epitaxial growth technique.

As the two layers are etched, the dielectric layer 8 is removed by buffer hydrofluoric acid, whereas the cap layer 7 is removed by a sulfuric acid type etchant.

After the etching operation, an n-InP buried layer is deposited on the n-InP clad layer 6 and the p-InP layer 10 to provide a smooth top surface for the two layers 6 and 10 in the first round of liquid phase epitaxial growth. Then, an n-InGaAsP contact layer 12 is formed on the buried layer 11 in the succeeding round of liquid phase epitaxial growth.

Thereafter, a p-side electrode 13 and an n-side electrode 14 are respectively formed on the lower surface of the substrate 1 and the upper surface of the contact layer 12 by means of a known technique.

Finally, the structure is cleaved along a (110) crystal plane to form a resonating plane on the structure. The finished semiconductor laser device will show a sectional view as illustrated in FIG. 1(c).

Referring to FIG. 1(c), the p-InGaAsP active layer 5 is in contact with the p-InP clad layer 4 and the n-InP clad layer 6 respectively at its upper and lower surfaces and with the p-InP layer 10 along its lateral surfaces to produce a heterojunction so that the device may have a narrow and confined active region.

Since the n-InP layer 9 which is a current blocking layer is not in contact with the lateral sides of the mesa above the mixed crystal layer 3, it is completely separated from the n-InP clad layer 6 and hence no leakage current can take place there.

When an electric current is injected in a semiconductor laser device as illustrated in FIG. 1(c) by way of the n-side electrode 14 and the p-side electrode 13, the injected current flows through only that part of the mesa constituted by an n-InP clad layer 6 and a p-InGaAsP active layer 5 and is perfectly prevented from dispersing by the pnp layer arrangement of a p-InP buffer layer 2, an n-InP layer 9 and a p-InP layer 10.

In view of the above structural features of a semiconductor laser device as described above and illustrated in FIG. 1(c), the buried layers need not be strictly controlled for the crystal film thickness when they are grown. Therefore, semiconductor laser devices of this type can be manufactured with a high yield even if the manufacturing process involves a liquid phase epitaxial growth technique which is not a very effective way of producing films with an even thickness.

While the active layer 5 of the above described embodiment is an InGaAsP layer that emits light having a wavelength of 1.3 m, it may alternatively emit light with a different wavelength so long as the layer is made of InGaAsP and the wavelength is found between 1.1 and 1.7m. The active layer 5 may have either a quantum well structure or a GIN-SCH structure or both.

Since the n-type buried blocking layer of a semiconductor laser device according to the invention is kept away from the lateral sides of the narrow mesa that comprises an active layer, no leakage current can occur between the n-type layer and the n-InP clad layer (which constitutes part of the double heterostructure of the device) and hence the device will show a low oscillation threshold current level and a high reliability.

The lateral sides of the double heterostructure of a semiconductor laser device is buried only with an n-type laser and a p-type layer as so many blocking layers by means of a liquid phase epitaxial growth technique in the process of producing the device by the method according to the invention. Thus, reliable semiconductor laser devices can be manufactured with a high yield by the method of the present invention.

What is claimed is:

1. A semiconductor laser device comprising a) a III-V group p-type compound semiconductor substrate, b) a mesa-shaped narrow and straight multilayer double heterostructure comprising an active layer and a mixed crystal layer with a shorter wavelength composition than that of said active layer and disposed underneath said active layer, and c) blocking layers formed on the lateral sides of said double hetero structure in a pnp layer arrangement, the n-type layer of said blocking layers being kept away from the lateral sides of the double heterostructure having an active layer.

2. A semiconductor laser device according to claim 1, wherein said double heterostructure comprises a mixed crystal layer containing a crystal capable of emitting light with a wavelength shorter than that of light emitted by the crystal of the active layer, said mixed crystal layer being disposed between the p-type compound semiconductor substrate and said active layer, and having a lattice plane of (111) facing the lateral sides of the mesa-shaped narrow structure.

3. A semiconductor laser device according to claim 1, wherein said p-type compound semiconductor substrate is made of InP.

4. A semiconductor laser device according to claim 2, wherein said mixed crystal layer is made of InGaAsP.

* * * * *